(12) United States Patent
Sunder et al.

(10) Patent No.: US 11,099,229 B2
(45) Date of Patent: Aug. 24, 2021

(54) CONNECTIVITY VERIFICATION FOR FLIP-CHIP AND ADVANCED PACKAGING TECHNOLOGIES

(71) Applicant: Cisco Technology, Inc., San Jose, CA (US)

(72) Inventors: Sanjay Sunder, Allentown, PA (US); Prajwal M. Kasturi, Breinigsville, PA (US); Joseph V. Pampanin, Hellertown, PA (US); Craig S. Appel, Macungie, PA (US)

(73) Assignee: Cisco Technology, Inc., San Jose, CA (US)

( * ) Notice: Subject to any disclaimer, the term of this patent is extended or adjusted under 35 U.S.C. 154(b) by 36 days.

(21) Appl. No.: 16/740,296

(22) Filed: Jan. 10, 2020

(65) Prior Publication Data
US 2021/0215754 A1    Jul. 15, 2021

(51) Int. Cl.
*G01R 31/28* (2006.01)
(52) U.S. Cl.
CPC ..... *G01R 31/2853* (2013.01); *G01R 31/2884* (2013.01); *G01R 31/2896* (2013.01)
(58) Field of Classification Search
CPC ............ G01R 31/2853; G01R 31/2884; G01R 31/2896
USPC ..................... 324/750.3, 537, 500
See application file for complete search history.

(56) References Cited

U.S. PATENT DOCUMENTS

| | | | |
|---|---|---|---|
| 6,320,201 B1 | 11/2001 | Corbett et al. | |
| 6,564,986 B1 | 5/2003 | Hsieh | |
| 2004/0019841 A1 | 1/2004 | Ong | |
| 2005/0007073 A1* | 1/2005 | James | G01R 19/16542 320/132 |
| 2015/0042349 A1* | 2/2015 | Yang | G01R 31/3835 324/426 |
| 2019/0361059 A1* | 11/2019 | Lamesch | G01D 5/24 |

OTHER PUBLICATIONS

Liu, Xingsheng & Hague, Sarfaraz & Wang, Jinggang & Lu, G. (2000). Packaging of integrated power electronics modules using flip-chip technology. 1. 290-296 vol. 1. 10.1109/APEC.2000.826118 [Abstract Only].
Fretz, M & Spinola Durante, Guido. (2018). Simulation of Daisy Chain Flip-Chip interconnections.

* cited by examiner

Primary Examiner — Giovanni Astacio-Oquendo
(74) Attorney, Agent, or Firm — Patterson + Sheridan, LLP (57) ABSTRACT

The fault detection system described provides an efficient method to test and monitor component to component connectivity in an electronic package using on chip test circuits and on chip components, which reduces the need for external testing equipment and analysis. The on chip nature allows for both real time testing in the assembly process of the electronic packages and during use of the electronic package by determining an on chip reference measurement and using the reference measurement to determine an operational status of the package.

20 Claims, 10 Drawing Sheets

CONNECTIVITY VERIFICATION FOR FLIP-CHIP AND ADVANCED PACKAGING TECHNOLOGIES

TECHNICAL FIELD

Embodiments presented in this disclosure generally relate to verifying chip-to-chip or component-to-component connectivity in flip chip and other three dimensional advanced electronic packaging. More specifically, embodiments described herein provide for checking and verifying that electrical connections between the various components of the electronic packages are functioning.

BACKGROUND

High density flip-chips are increasingly used in many electronic devices and integrated circuits. The manufacturing processes for these advanced packaging technologies, using 2-dimensional, 2.5-dimensional, or 3-dimensional integration, are complicated and include many opportunities for small flaws and defects to be introduced into the electronic packages, including bad connectivity between the various components of the electronic packages. These defects can cause significant yield loss and increase the cost of manufacturing for the electronic packages if not discovered and remedied in the manufacturing process. Checking for these defects and verifying connectivity between the various components remains a challenge in both the manufacturing process and the ongoing use of the electronic packages.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a method, the method including: determining a reference measurement for an electronic flow path in an integrated electronic package and measuring, at an internal measurement circuit, a performance measurement for the electronic flow path. The method also includes determining, based on the reference measurement and the performance measurement, an operational status of the electronic flow path in the integrated electronic package and initiating, at the internal measurement circuit, a fault detection monitoring process for the integrated electronic package based on the determined operational status. Other embodiments of this aspect include corresponding computer systems, apparatus, and computer programs recorded on one or more computer storage devices, each configured to perform the actions of the methods.

One general aspect includes a system. The system includes a current source on an integrated electronic package, a measurement circuit on the integrated electronic package, and a voltage sense circuit. The system also includes a processor; and a memory may include instructions which, when executed on the processor, performs an operation, the operation may include: determining a reference measurement for an electronic flow path in an integrated electronic package and measuring, at the measurement circuit, a performance measurement for the electronic flow path. The method also includes determining, based on the reference measurement and the performance measurement, an operational status of the electronic flow path in the integrated electronic package and initiating, at the measurement circuit, a fault detection monitoring process for the integrated electronic package based on the determined operational status.

One general aspect includes a computer program product may include a non-transitory computer-readable medium program having program instructions embodied therewith, the program instructions executable by a processor to perform an operation. The operation includes: determining a reference measurement for an electronic flow path in an integrated electronic package and measuring, at an internal measurement circuit, a performance measurement for the electronic flow path. The operation also includes determining, based on the reference measurement and the performance measurement, an operational status of the electronic flow path in the integrated electronic package and initiating, at the internal measurement circuit, a fault detection monitoring process for the integrated electronic package based on the determined operational status.

Example Embodiments

For advanced electronic packages, chip-to-chip connections using wirebonds are subject to limitations on data rates and other connection limitations between the various components of the electronic packages. As a result, traditional wirebonded packaging schemes are being replaced with advanced packaging methods such as flip-chip (FC) and fan out wafer level packaging (FoWLP). These packaging methodologies are instrumental in allowing greatly increased data rates in the various electronic packages.

These packaging methods also result in increased complexity in the manufacturing process. For example, the use of copper (Cu) pillars and FC bumps in for FC packages, requires precise manufacturing to avoid defects in the electronic packages. However, even with precise manufacturing processes, defects in the packages may occur. The presence of defects can cause significant yield loss, especially when discovered late in the manufacturing process, where the ability to remedying the defect is lower. For example, a connectivity fault discovered once the package has been completely assembled and installed in a larger device can result in loss of the package and the device. As a result, early detection of defects, such as connectivity defects between components of electronic packages can decrease the cost and increase the efficiency of the manufacturing process.

Current methods to test for defects and faults (e.g., connection faults between the various components of the electronic packages) require specialized external equipment and can also result in time delays and decreased efficiency in the manufacturing process since the packages are taken out of the assembly process for external testing. Moreover, once the electronic packages are installed in an electronic device and in use, connectivity faults and other issues may arise during use of the electronic packages. For example, a connection fault may develop during the use of the electronic package. Assessing, detecting, and identifying the cause of defects such as connection faults presents a challenge in both the manufacturing and the use of the electronic packages.

The systems and methods described herein provide an efficient method to test and monitor component to component connectivity in an electronic package using on chip test circuits and on chip components, thus eliminating the need for external testing equipment and analysis. The on chip nature allows for both real time testing in the assembly process of the electronic packages and during use of the electronic package.

Figure 1:
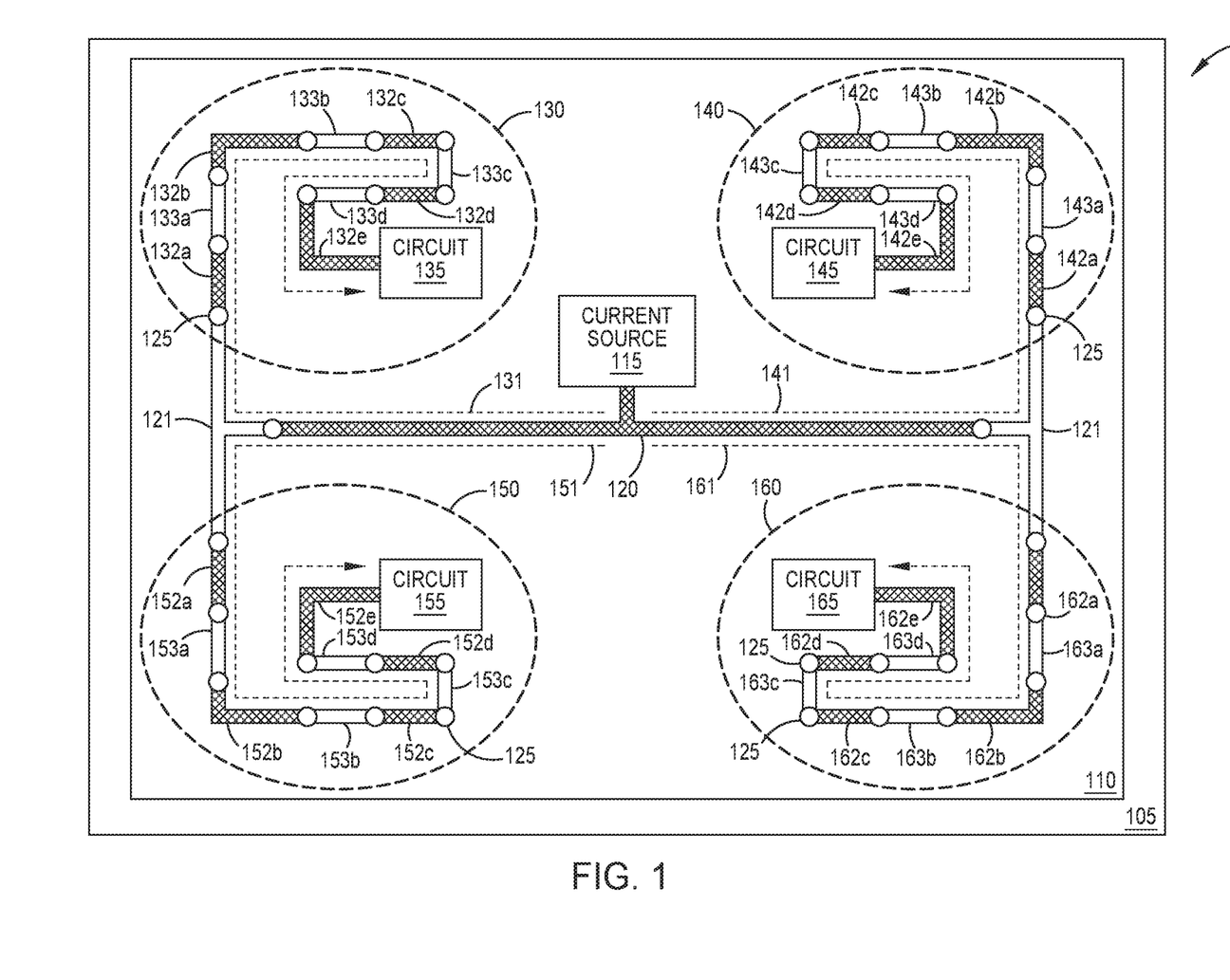
FIG. 1 illustrates a top view of an example electronic package, according to embodiments described herein.

FIG. 1 illustrates a top view of an example electronic package, package 100, according to embodiments described herein. The package 100 is an electronic package including multiple integrated components. For example, as described herein, the package 100 is a FC electronic package. While described in relation to FC packages, the package 100 may also include other types of electronic packages such as a FoWLP package, interposers, and/or other through-silicon-vias based packages. The package 100 includes an interposer integrated circuit (IC), (IC 105), and an electrical IC, (IC 110). The IC 110 and the IC 105 are electronically integrated and connected via one or more components described in FIG. 2. The IC 105 and the IC 110 may also be packaged with one or more other ICs in the package 100 such that multiple ICs are integrated and connected together, where each IC includes the various checking and verification components forming the fault detection system described herein.

The package 100 includes several electronic flow paths between at least two integrated circuits, such as the IC 105 and the IC 110 which are tested to ensure connectivity between the components of the package 100. For example, the electronic flow paths include flow paths 131, 141, 151, and 161. The various flow paths flow through associated circuits, daisy chains, or test loops connecting the IC 105 and the IC 110. For example, the package 100 includes the test loops 130, 140, 150, and 160 associated with the respective flow paths, flow paths 131, 141, 151, and 161. Each of the flow loops has path elements such as routing sections on the IC 105 and the IC 110.

In some examples, the placement of the test loops 130-160 on the package is to cover any area which may be susceptible to faults. For example, the corners in the package 100 may be more susceptible to mechanical stress which can cause packaging defects such as connection faults. In some examples, the package 100 may also include a horizontal and/or a vertical test loop (e.g., a daisy chain) through the center of the IC 105 to test for faults or other defects in the IC 105.

In some examples, the test loops 130-160 may be associated with a single reference current source, such as current source 115, where the routing section 120 is on the IC 110 and provides the electrical current for each of the test loops 130-160 and flow paths 131-161. In another example, the current source 115 may include several different current reference sources (e.g., a reference current source for each of the individual test loops, for a subset of the test loops, etc.). The current sources may include a standard current source circuit embedded in or on the package 100 and controllable by a fault detection system. In some examples, the fault detection system as described in relation to FIG. 6 includes an on-chip CPU and the associated firmware controls which controls the internal test components and the overall test procedure.

The routing section 120 provides an electrical connection between the current source 115 and connection points 125 between the IC 105 and the IC 110. The connection points 125 may each include a bump connection (e.g., a solder bump) and a Cu pillar between the IC 105 and the IC 110 as described in relation to FIG. 2. The routing sections 121 provide electrical connection for the test loops 130-160 on the IC 110 and the IC 105. In the test loop 130, routing sections 132a-e route sections on the IC 110 between various connection points 125 and routing sections 133a-d route sections on the IC 105 between various connection points 125 in the test loop 130. Similarly, the test loop 140 includes routing sections 142a-e on the IC 110 between various connection points 125 and routing sections 143a-d on the IC 105. The test loop 150 includes routing sections 152a-e on the IC 110 between various connection points 125 and routing sections 153a-d on the IC 105. The test loop 160 includes routing sections 162a-e on the IC 110 between various connection points 125 and routing sections 163a-d on the IC 105. The test loops 130-160 also include associated measurement circuits (e.g., measurement circuits 135-165) which measure the properties of the electric flow through the test loops during assembly and testing and during the use of the package 100. In another example, the measurement circuits 135-165 may be collocated as a single measurement circuit.

The plurality of test loops 130-160 provides coverage of the package 100 to check and verify that the IC 110 and IC 105 are connected and reduces the probability of packaging defects showing up at a later stage in assembly. Each individual test loop and the various routing sections and connection points may be checked independently as describe herein relation to FIGS. 2-5D.

Figure 2:
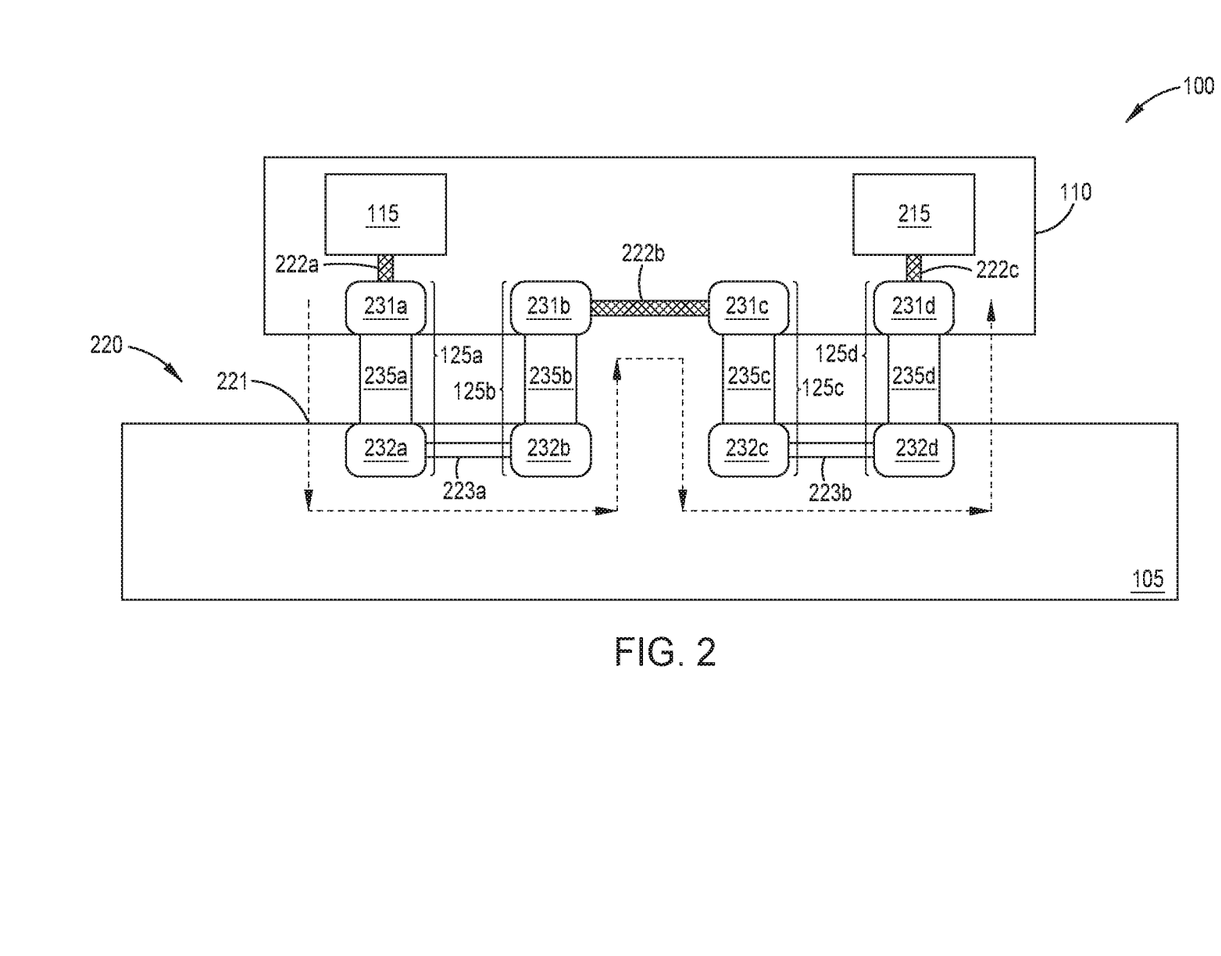
FIG. 2 illustrates a side view of an example electronic package, according to embodiments described herein.

FIG. 2 illustrates a side view of an example electronic package, according to embodiments described herein. A test loop 220 with a flow path 221 is shown between the IC 105 and the IC 110. The flow path 221 may include any of the flow paths 131-161 discussed in relation to FIG. 1. The flow path 221 begins at the current source 115 and includes a first routing section, routing section 222a between the current source 115 and a connection point 125a. The connection points 125a-125d each include bumps (e.g., solder bumps) on the IC 110 and the IC 105 with Cu pillars 235a-235d in between the bumps on the IC 110 (bumps 231*a*-231*d*) and the bumps on the IC 105 (bumps 232*a*-232*d*). Routing sections 223*a* and 223*b* provide a path for the flow path through the IC 105 and routing sections 222*b* and 222*c* provide a path for the flow path through the IC 110 and to the measurement circuit 215. The measurement circuit 215 may include a standard measurement circuit embedded in or on the IC 110 and including control and stimulus circuits such that the measurement circuit 215 is controllable by the fault detection system. The routing sections and the connection points make up various path elements that may experience faults during the manufacture/assembly of the package 100 and/or during the use of the package 100. While the systems and methods described herein are directed to testing connectivity faults, other faults and defects such as electromigration, ageing, or localized heating (which may cause similar connectivity faults) can be also be detected.

As described herein, the positioning and alignment of IC 105 and IC 110 during manufacturing of the package 100 can result in connectivity issues between the various components. For example, the bumps and the Cu pillars in the various connection points 125*a*-125*d* may not be properly aligned and/or connected such that an electrical connection is provided between the IC 105 and the IC 110. In some examples, a defect may not be detectable or detected until the package 100 is in use in an electronic device. For example, a defect may provide an initial electrical connection, but may degrade over a period of time during usage and the electrical connection between the IC 105 and the IC 110 is lost. For these reasons, a real time in package electrical check and verification mechanism is needed as described in further detail in relation to FIGS. 3-4.

Figure 3:
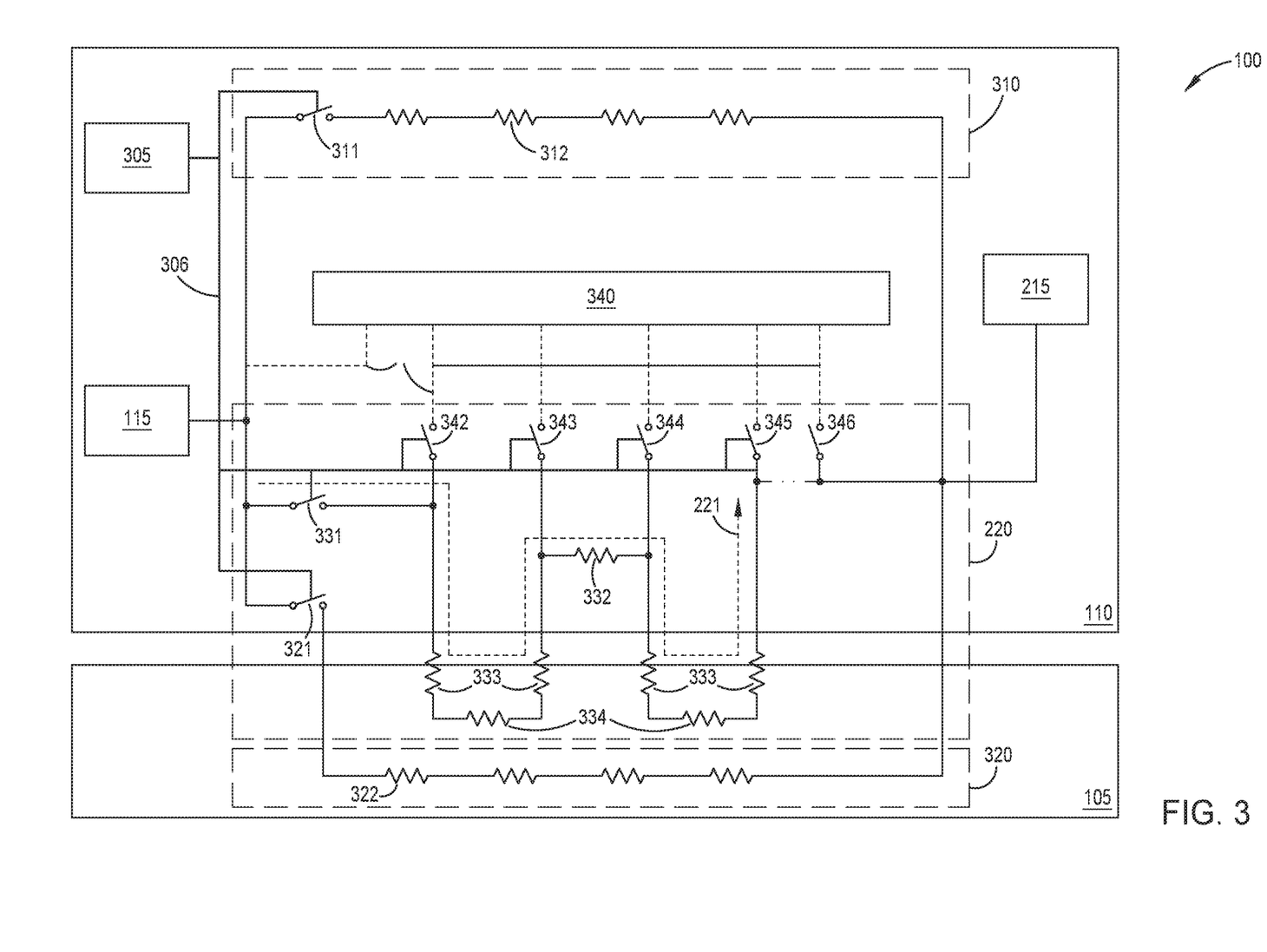
FIG. 3 illustrates a schematic circuit diagram for an example electronic package, according to embodiments described herein.
Figure 4A:
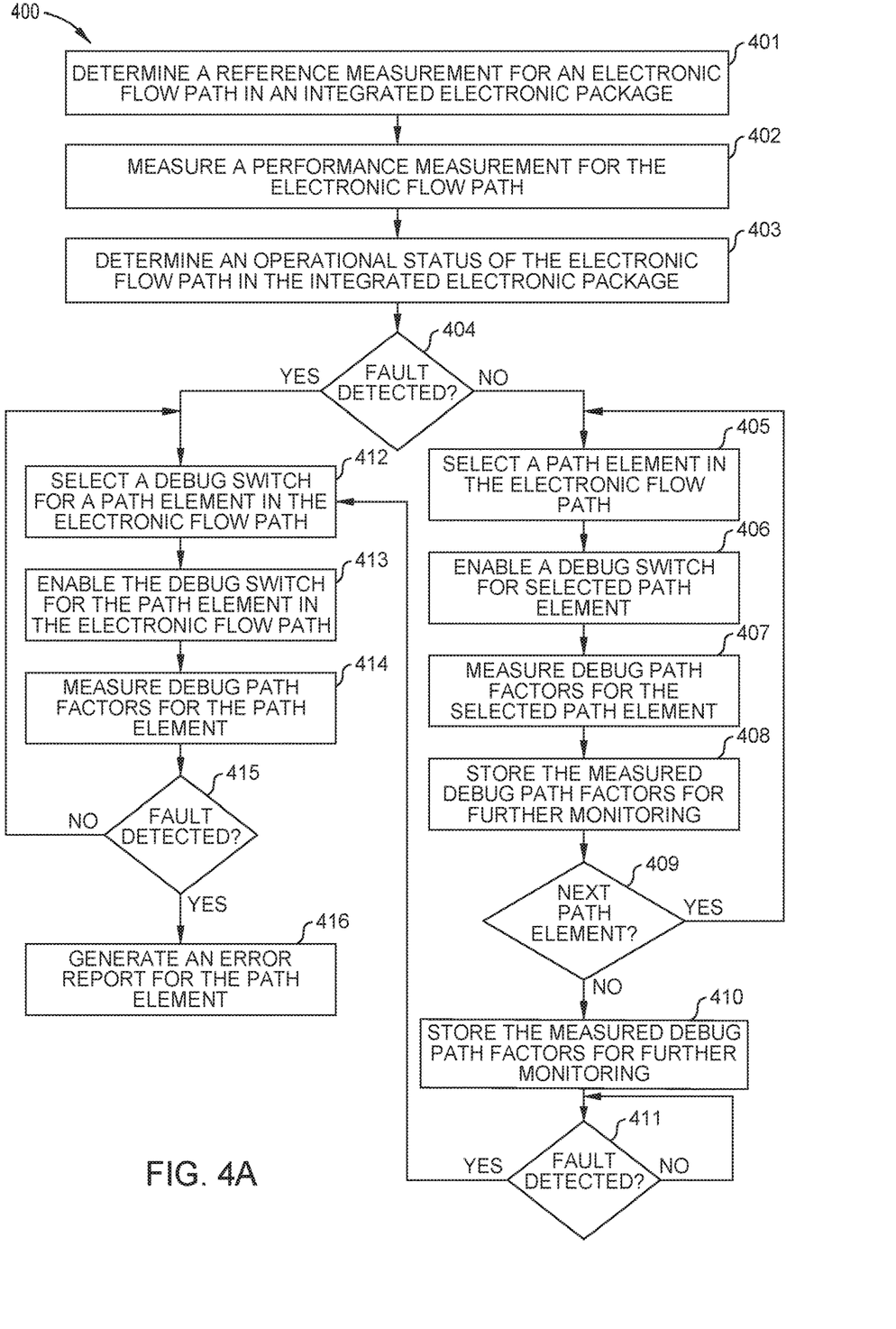
FIGS. 4A-4B are methods for fault detection in an electronic package, according to one embodiment described herein.
Figure 4B:
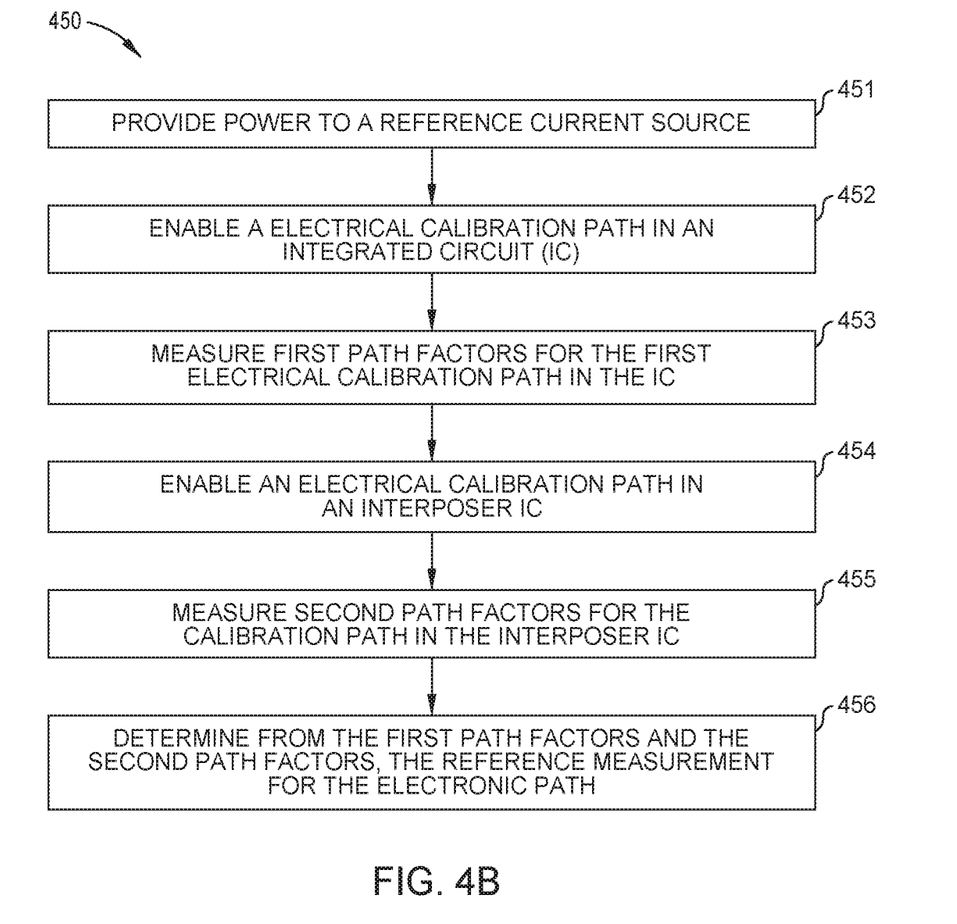

FIG. 3 illustrates a schematic circuit diagram for an example electronic package, according to embodiments described herein. The package 100 includes the flow path 221, discussed in FIG. 2 The IC 110 also includes a state machine 305 which controls the various flow paths shown in FIG. 3 through a state machine control path 306. A calibration path 310 for the IC 110 includes a switch 311 under control of the state machine 305 and a resistance for the path, resistance 312. A calibration path 320 for the IC 105 includes a switch 321 under control of the state machine 305 and a resistance for the path, resistance 322. The flow path 221 includes a switch 331 under control of the state machine 305 and various resistances, including the resistance of the path in the IC 110, resistance 332, resistance of the connections points (resistances 333), and the resistance of the path in the IC 105 (resistances 334).

The package 100 also includes a voltage sense circuit 340 connected to the flow path 221 with debug switches 342-346 under control of the state machine 305 and the voltage sense circuit 340. As described in relation to FIGS. 4A-5D, the various components shown in FIG. 3 can determine a reference measurement for the electronic flow path, e.g., flow path 221, and determine whether there are any faults using the reference measurement.

FIGS. 4A-4B are methods for fault detection in an electronic package, according to one embodiment described herein. These methods provide real time detection and monitoring in the various electronic packages during assembly and installed use of the package. FIGS. 5A-D illustrate schematic circuit diagrams for an example electronic packages in various states and are referred to throughout the discussion of FIGS. 4A-B.

Method 400 begins at block 401, where the fault detection system determines a reference measurement for an electronic flow path in an integrated electronic package (e.g., package 100). For example, as shown in FIGS. 2 and 3, a reference measurement, such as a reference current, is determined for the flow path 221. In some examples, the reference measurement is determined according to method 450 described in FIG. 4B.

Figure 5A:
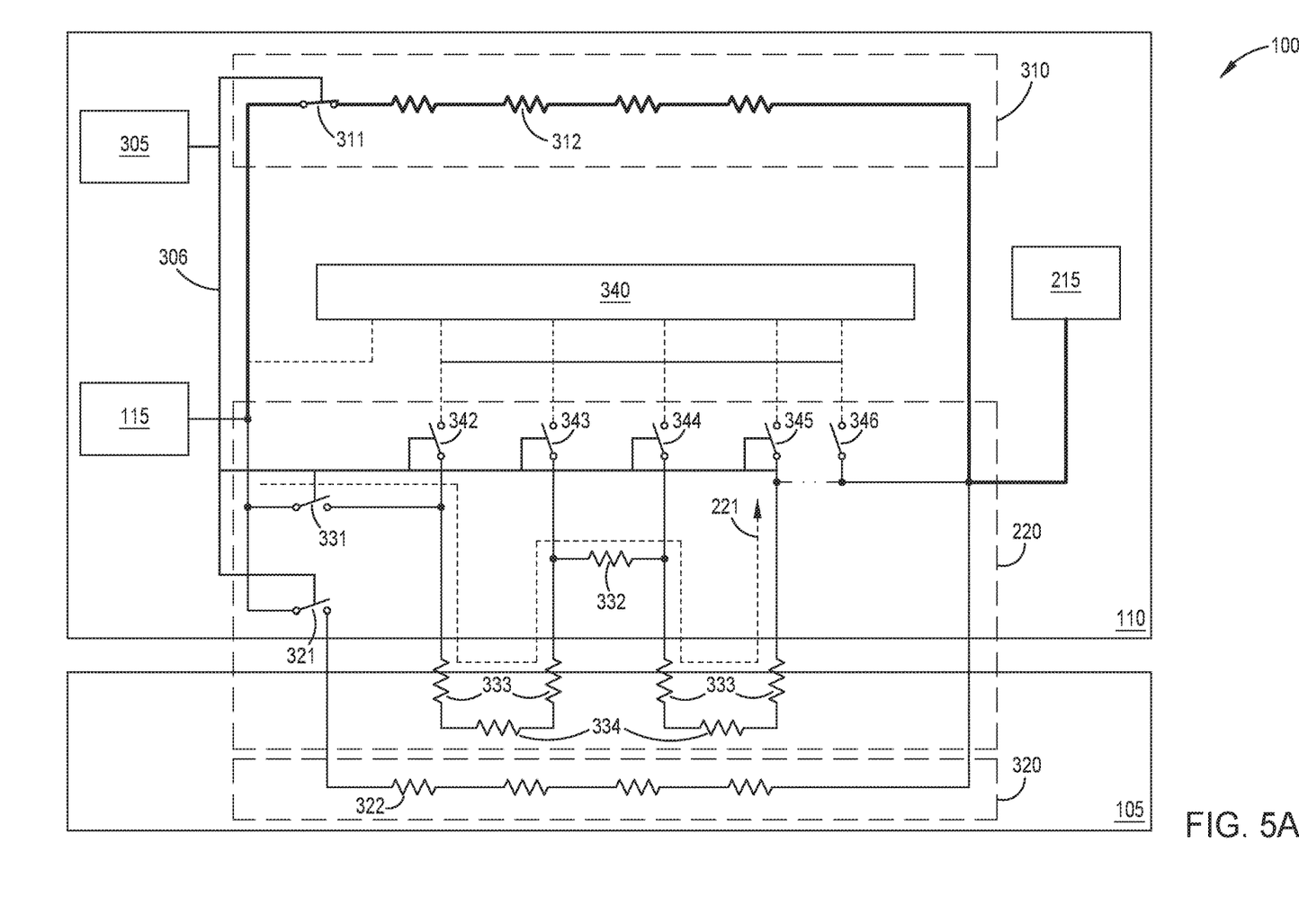
FIGS. 5A-D illustrate schematic circuit diagrams for example electronic packages in various states, according to embodiments described herein.

Method 450 begins at block 451, where the fault detection system provides power to a reference current source in the integrated electronic package. For example, the fault detection system powers on the current source 115 as shown in FIG. 5A such that the current source 115 injects an electrical current into the package 100. At block 452, the state machine 305 enables an electrical calibration path in an IC of the integrated electronic package. For example, as shown in FIG. 5A, the state machine 305 enables the calibration path 310 for the IC 110 by closing the switch 311. At block 453, the measurement circuit 215 measures first electronic flow path factors (e.g., current, voltage, resistance, etc.) for the first electrical calibration path in the IC. For example, the measurement circuit 215 measures a current received from the calibration path 310. The measurement circuit 215 also measures voltage received via the calibration path 310. In some examples, the fault detection system determines the resistance 312 for the calibration path 310 from the measured voltage and current.

Figure 5B:
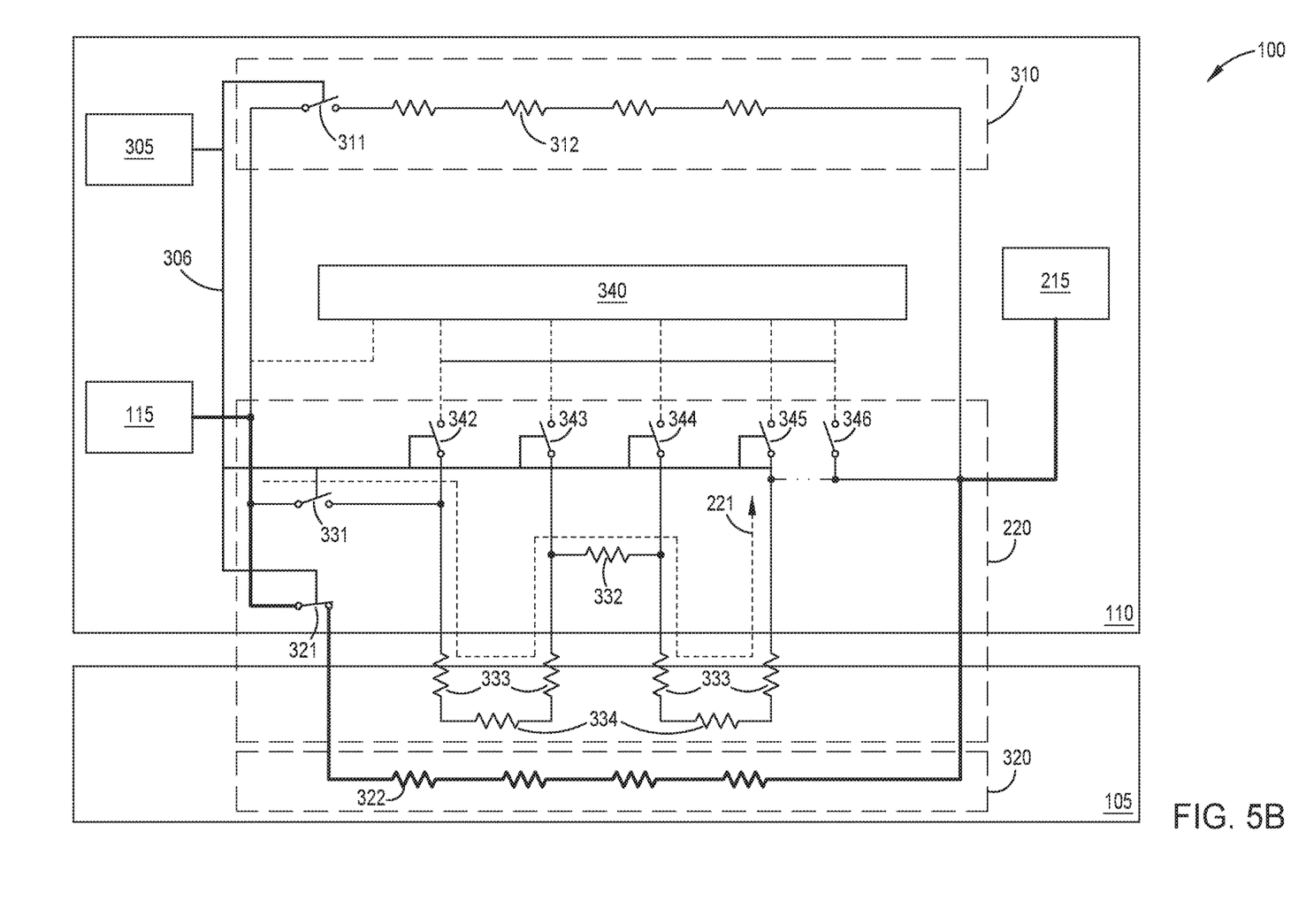

At block 454, the state machine 305 enables an electrical calibration path in an interposer IC of the integrated electronic package. For example as shown in FIG. 5B, the state machine the 305 enables the calibration path 320 by closing the switch 321 (the state machine also opens the switch 311 closed at block 452). At block 455, the measurement circuit measures second path factors for the calibration path in the interposer IC. For example, the measurement circuit 215 measures a current received from the calibration path 320. The measurement circuit 215 also measures voltage received via the calibration path 320. From the measured voltage and current the fault detection system determines the resistance 322 for the calibration path 320. At block 456, the fault detection system determines from the first path factors and the second path factors, the reference measurement for the electronic flow path. For example, fault detection system uses the determined resistance 322 and resistance 312 to determine an expected resistance for the flow path 221. In some examples, known properties of the flow path 221 are also used to determine the expected resistance. For example, a number of connection points (e.g., connection points 125*a*-*d*) in the flow path 221 are factored into the expected resistance to account for the additional resistance provided by the solder, Cu pillars, etc. In some examples, the reference measurement is an expected value of the voltage, current, and resistance for the flow path 221 based on the calibration path measurements and expected resistances.

Figure 5C:
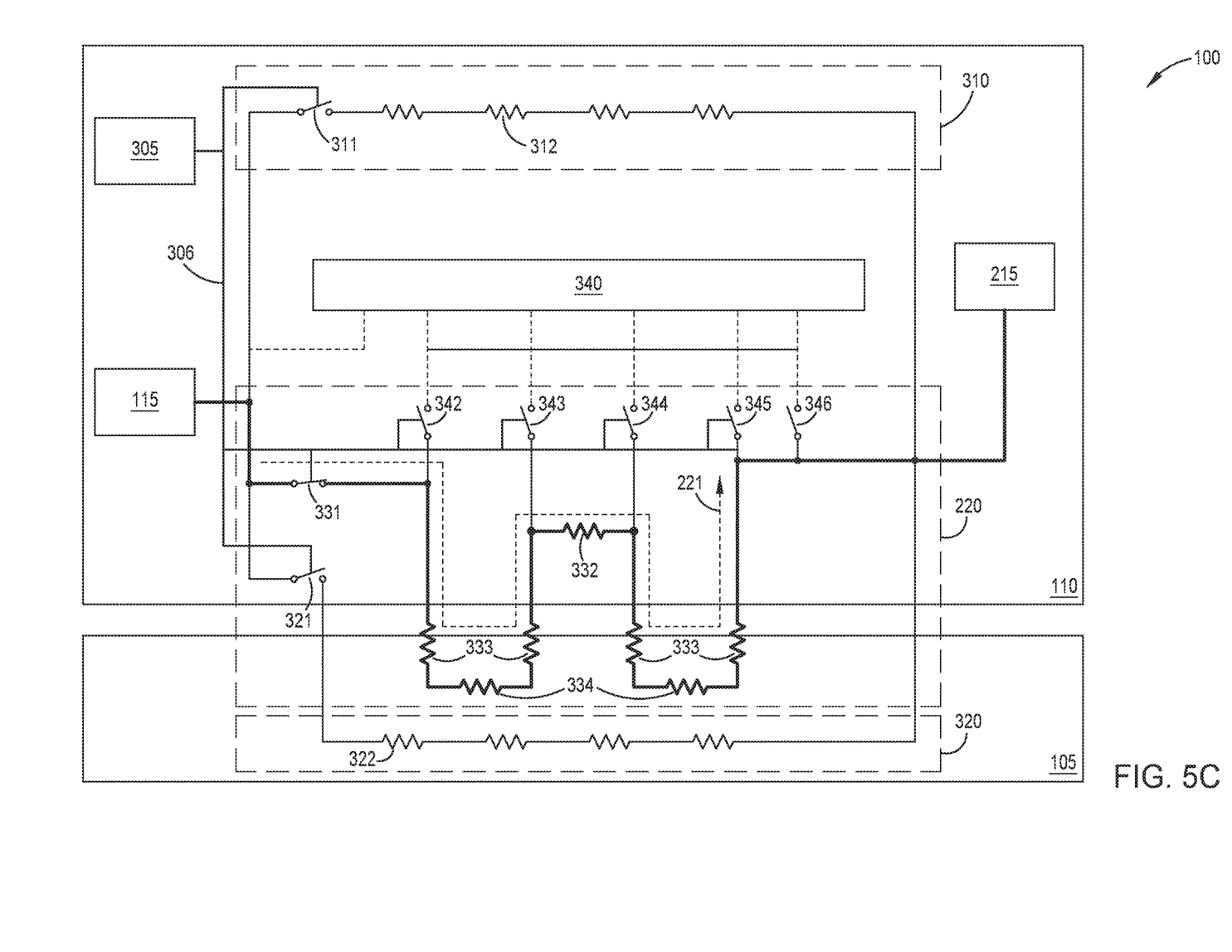

Returning back to FIG. 4A, the method 400 continues at block 402, where the internal measurement circuit, measures a performance measurement for the electronic flow path. In some examples, as shown in FIG. 5C, the state machine 305 enables the electronic flow path, flow path 221, by closing the switch 331 and measures, at the measurement circuit 215, a performance measurement for the electronic flow path, flow path 221. In some examples, the calibration paths enabled in method 450 are disabled by opening the associated switches (e.g., switch 311 and switch 321). In some examples, the measurement circuit 215 measures a current received from the flow path 221. The measurement circuit 215 also measures voltage received via the flow path 221. From the measured voltage and current the fault detection system can also determine the resistance for the flow path 221 which includes the sum of the resistance in the IC 105, the IC 110, and the connection points 125a-d. The resistance of the particular path elements can be determined in more detail using the voltage sense circuit 340 as described herein.

At block 403, the fault detection system determines an operational status of the electronic flow path in the integrated electronic package, based on the reference measurement and the performance measurement. For example, at block 404, the fault detection system compares the reference measurement to the performance measurement. In some examples, the fault detection system compares the reference measurement (i.e. the expected measurement for the flow) to the measured performance measurement. When the reference measurement and the performance measurement are equal or nearly equal (e.g., within a small margin of error) the operational status is considered a functional operational status where the connection points 125a-d are connected with no detected faults. When the reference measurement and the performance measurement are not equal (e.g., the performance measurement is less than the expected value or not measurable) the operational status is considered a fault detected status. This may indicate that there are connection issues between the IC 105 and the IC 110 such as faults at one or more of the connection points 125a-d.

In an example where a fault is not detected (i.e., the comparison indicates that the flow path 221 is connected), method 400 proceeds to block 405 where the fault detection system and the voltage sense circuit 340 enter into a loop process to determine various properties for each path element. At block 405, the voltage fault detection system selects a path element in the electric flow path and enables a first debug switch for the selected path element of a plurality of path elements in the electronic flow path at block 406. For example, the debug switch 342 is closed and the voltage for the first section of the test loop 220 is determined using the voltage sense circuit 340. For example, the first path section may include the elements of the path associated with the connection point 125a, including the routing section 222a and connection point 125a.

At block 407, the measurement circuit 215 and/or the voltage sense circuit 340 measure debug path factors for the selected path element and stores the measured debug path factors for further monitoring at block 408. For example, the voltage sense circuit 340 measures a voltage for the first debug switch, e.g., debug switch 342, and stores the determined voltage for the selected section for later monitoring. At block 409, the fault detection system determines whether all of the path elements/sections have been measured and tested (e.g., all debug switches in the voltage sense circuit 340 have been tested). When unmeasured path elements remain, method 400 returns to block 405 to test a next debug switch. When all path elements have been measured, method 400 proceeds to block 410, where the fault detection system collectively stores the measured debug factors for further monitoring. For example, the various voltages and other debug path factors are used to determine locations of potential faults during the use of the package 100.

At block 411, the fault detection system monitors the flow path 221 for faults. For example, during a typical use cycle for the package 100, the fault detection system monitors the various test loops in real time to determine whether a connectivity issue develops. In an example where the fault detection system detects a fault, method 400 proceeds to block 412.

Returning back to block 404, in an example where a fault is detected, method 400 proceeds to block 412 and enters into a fault detection loop using the voltage sense circuit 340 at blocks 413-415. For example, the fault detection system and the voltage sense circuit 340 may proceed through each of the segments of the electronic flow path for each of the connection points 125a-d shown in FIG. 5D. At block 412, the fault detection system and the voltage sense circuit 340 selects a debug switch for a path element in the electronic flow path for fault detection. For example, the state machine 305 selects the first segment associated with the debug switch 342 to test the first segment of the electronic flow path associated with the connection point 125a. At block 413, the state machine 305 enables the debug switch 342 and 346 and at block 414, the voltage sense circuit 340 and the measurement circuit 215 measures debug path factors for the selected path element. The debug path factors include voltage, current, resistance, etc. for the selected path element.

At block 414 the fault detection system detects a fault status for the selected path element. For example, based on the measured path factors, the voltage sense circuit and the path factors may indicate that a fault is present. The fault may be detected based solely on the measured path factors for the selected element. For example, if a current is not measured or the voltage is significantly different across the selected path element, a fault is detected. In an example where the fault detection system has previously measured the debug path factors for the path element such as described in relation to blocks 405-409, the fault detection system also uses the previously measured path factors to determine the presence of a fault.

Figure 5D:
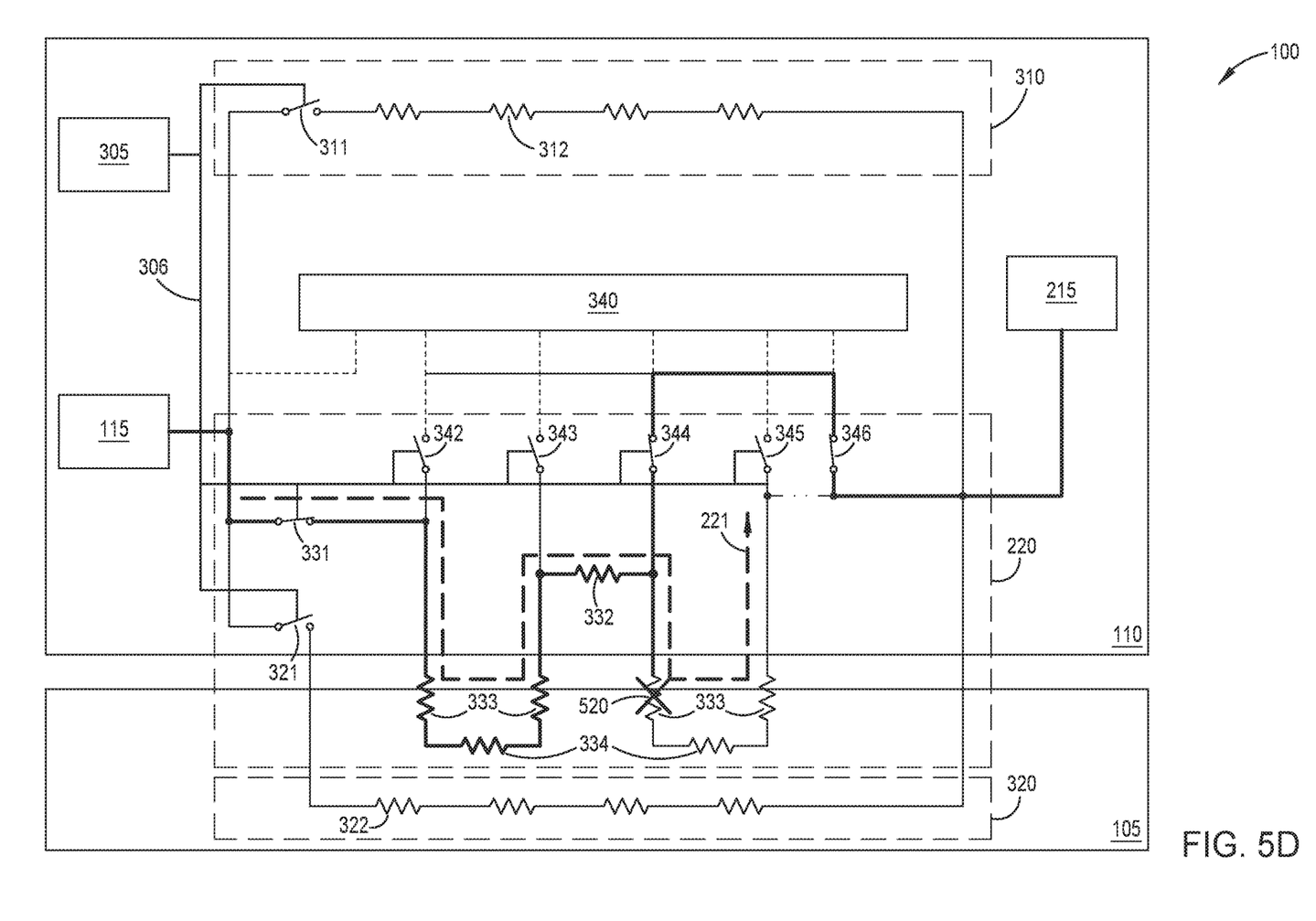

For example, as shown in FIG. 5D, the selected path element is the segment of the path associated with the connection point 125c, which is experiencing a connection fault 520. The switches 344 and 346 are enabled and the voltage sense module and the measure circuit 215 indicate that an abnormal voltage and other path factors are measured when the switch 344 is closed indicating there is a fault in the connection point 125c (or the path elements associated with the connection point 125c).

In an example where no fault is detected, method 400 proceeds back to block 412 to select a next path element for analysis for a fault. When the fault is detected method 400 proceeds to block 416 where the fault detection system generates an error report for the path element which includes the detected fault. For example, the fault detection system generates a report indicating the connection point 125c has a connection fault as shown in FIG. 5D. In examples, where the fault is detected in a manufacturing process, the report can be used by a manufacturer to quickly identify the location of the fault to prevent further loss and to correct any manufacturing process as needed. In an example where the fault is detected in the use of the package 100, the report indicates a location within the large electronic device including the package 100 and may simplify the remedial process to correct for the fault. In some examples, fault details in the report are used by a manufacturer to perform examinations of the package (e.g. X-ray cross sections to determine how stress may be causing these faults and defects). Additionally the manufacturer may perform an elemental analysis to determine if there are any contaminants such as oxides or other such issues are causing defects and faults, among other remedial processes and techniques.

Figure 6:
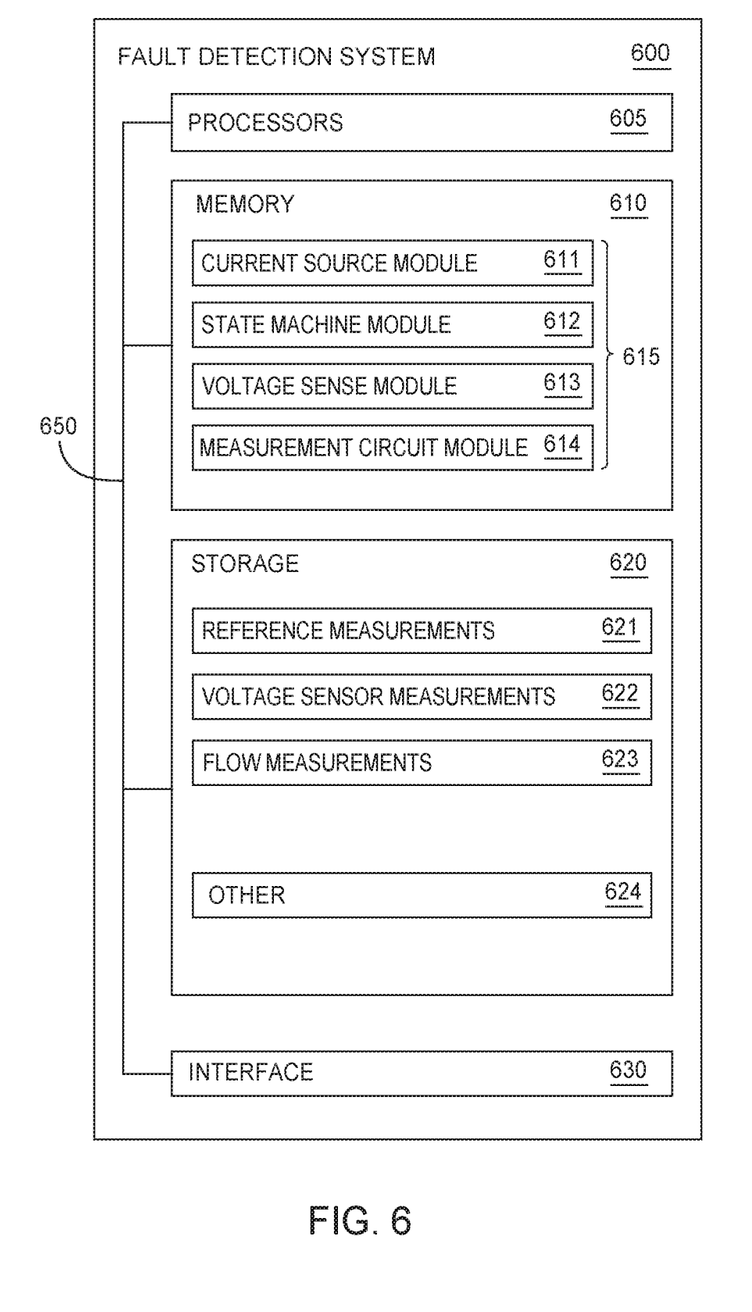
FIG. 6 is a block diagram of a fault detection system, according to one embodiment described herein.

FIG. 6 depicts a fault detection system 600, according to one embodiment described herein. The fault detection system 600 is shown in the form of a general-purpose computing device, and may include software and or firmware executing on an electronic package, e.g., package 100. The components of the fault detection system 600 may include, but are not limited to, one or more processing units or processors 605, a memory 610, a storage system 620, an interface 630 connecting the fault detection system 600 to the various components on the package 100 and other input/output components, and a bus 650 that couples various system components including the memory 610 and storage system 620 to processors 605 along with the various input/output components (not shown). In other embodiments, the fault detection system 600 (and the modules 615) is distributed and includes a plurality of discrete computing devices distributed on the package 100.

Bus 650 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The fault detection system 600 typically includes a variety of computer system readable media. Such media may be any available media that is accessible by the fault detection system 600, and it includes both volatile and non-volatile media, removable and non-removable media.

Memory 610 can include computer system readable media in the form of volatile memory, such as random access memory (RAM) and/or cache memory. The fault detection system 600 may further include other removable/non-removable, volatile/non-volatile computer system storage media. By way of example, storage system 620 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a Compact Disc Read-Only Memory (CD-ROM), digital versatile disc-read only memory (DVD-ROM) or other optical media can be provided. In such instances, each can be connected to bus 650 by one or more data media interfaces. As will be further depicted and described below, memory 610 may include at least one program product having a set (e.g., at least one) of program modules that are configured to carry out the functions of various embodiments described herein.

The fault detection system 600 may further include other removable/non-removable, volatile/non-volatile computer system storage media. In some examples, storage system 620 may be included as part of memory 610 and may typically provide a non-volatile memory for the networked computing devices, and may include one or more different storage elements such as Flash memory, a hard disk drive, a solid state drive, an optical storage device, and/or a magnetic storage device. For example, storage system 620 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 650 by one or more data media interfaces. Storage system 620 may include media for a list of managed reference measurements 621, voltage sensor measurements 622, flow measurements 623, and other information 624 stored for access and use by the fault detection system 600.

Memory 610 may include a plurality of modules 615 for performing various functions described herein. The modules 615 generally include program code that is executable by one or more of the processors 605 and control the various functions of the components of the package 100 described herein. As shown, modules 615 include the current source module 611, state machine module 612, voltage sense module 613, and measurement circuit module 614. The modules 615 may also interact with each other and storage system 620 to perform certain functions as described herein.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. A method comprising:
   determining a reference measurement for an electronic flow path between at least two integrated circuits in an electronic package;
   measuring, at an internal measurement circuit on one of the at least two integrated circuits, a performance measurement for the electronic flow path;
   determining, based on the reference measurement and the performance measurement, an operational status of the electronic flow path, wherein the operational status comprises one of an functional operational status or a fault detected status; and
   initiating, at the internal measurement circuit, a fault detection monitoring process for the electronic package based on the operational status.

2. The method of claim 1, wherein determining the reference measurement comprises:
   providing power to a reference current source in the electronic package;
   enabling, via a state machine, a first electrical calibration path in an integrated circuit (IC) of the electronic package;
   measuring first path factors for the first electrical calibration path in the IC;
   enabling, via the state machine, a second electrical calibration path in an interposer IC of the electronic package;
   measuring second path factors for the second electrical calibration path in the interposer IC; and
   determining from the first path factors and the second path factors, the reference measurement for the electronic flow path.

3. The method of claim 1, wherein measuring the performance measurement for the electronic flow path comprises:
   enabling, via a state machine, the electronic flow path; and
   measuring electronic flow path factors via the internal measurement circuit.

4. The method of claim 1, wherein determining the operational status comprises:
   comparing the reference measurement to the performance measurement; and
   wherein when the reference measurement is equal to the performance measurement the operational status is the functional operational status, and
   wherein a fault in the electronic flow path is detected when the reference measurement is less than the performance measurement the operational status is the fault detected status.

5. The method of claim 4, wherein when the operational status is the fault detected status, initiating the fault detection monitoring process for the electronic package further comprises:
   enabling a first debug switch for a first path element of a plurality of path elements in the electronic flow path;
   measuring debug path factors for the first path element;
   detecting a fault status for the first path element;
   when the fault status for the first path element indicates a connection fault is present, generating an error report for the first path element; and
   when the fault status for the first path element indicates a connection fault is not detected, enabling a next debug switch for a next path element.

6. The method of claim 4, wherein when the operational status is the functional operational status, initiating the fault detection monitoring process for the electronic package further comprises:
   enabling a debug switch for each path element of a plurality of path elements in the electronic flow path;
   measuring debug path factors for the path element associated with a currently enabled debug switch; and
   storing the debug path factors for further monitoring.

7. The method of claim 6, further comprising:
detecting, using the debug path factors, a connection fault in a second path element in the electronic flow path.

8. A system, comprising:
a current source on an electronic package,
a measurement circuit on the electronic package,
a voltage sense circuit,
a processor; and
a memory comprising instructions which, when executed on the processor, performs an operation, the operation comprising:
determining a reference measurement for an electronic flow path between at least two integrated circuits in the electronic package;
measuring, at an internal measurement circuit on one of the at least two integrated circuits, a performance measurement for the electronic flow path;
determining, based on the reference measurement and the performance measurement, an operational status of the electronic flow path, wherein the operational status comprises one of an functional operational status or a fault detected status; and
initiating, at the internal measurement circuit, a fault detection monitoring process for the electronic package based on the operational status.

9. The system of claim 8, wherein determining the reference measurement comprises:
providing power to a reference current source in the electronic package;
enabling, via a state machine, a first electrical calibration path in an integrated circuit (IC) of the electronic package;
measuring first path factors for the first electrical calibration path in the IC;
enabling, via the state machine, a second electrical calibration path in an interposer IC of the electronic package;
measuring second path factors for the second electrical calibration path in the interposer IC; and
determining from the first path factors and the second path factors, the reference measurement for the electronic flow path.

10. The system of claim 8, wherein measuring the performance measurement for the electronic flow path comprises:
enabling, via a state machine, the electronic flow path; and
measuring electronic flow path factors via the measurement circuit.

11. The system of claim 8, wherein determining the operational status comprises:
comparing the reference measurement to the performance measurement; and
wherein when the reference measurement is equal to the performance measurement the operational status is the functional operational status, and
wherein a fault in the electronic flow path is detected when the reference measurement is less than the performance measurement the operational status is a fault detected status.

12. The system of claim 11, wherein when the operational status is the fault detected status, initiating the fault detection monitoring process for the electronic package further comprises:
enabling a first debug switch for a first path element of a plurality of path elements in the electronic flow path;
measuring debug path factors for the first path element;
detecting a fault status for the first path element;
when the fault status for the first path element indicates a connection fault is present, generating an error report for the first path element; and
when the fault status for the first path element indicates a connection fault is not detected, enabling a next debug switch for a next path element.

13. The system of claim 11, wherein when the operational status is the functional operational status, initiating the fault detection monitoring process for the electronic package further comprises:
enabling a debug switch for each path element of a plurality of path elements in the electronic flow path;
measuring debug path factors for the path element associated with a currently enabled debug switch; and
storing the debug path factors for further monitoring.

14. The system of claim 13, further comprising:
detecting, using the debug path factors, a connection fault in a second path element in the electronic flow path.

15. A computer program product comprising a non-transitory computer-readable medium program having program instructions embodied therewith, the program instructions executable by a processor to perform an operation comprising:
determining a reference measurement for an electronic flow path between at least two integrated circuits in an electronic package;
measuring, at an internal measurement circuit on one of the at least two integrated circuits, a performance measurement for the electronic flow path;
determining, based on the reference measurement and the performance measurement, an operational status of the electronic flow path, wherein the operational status comprises one of an functional operational status or a fault detected status; and
initiating, at the internal measurement circuit, a fault detection monitoring process for the electronic package based on the operational status.

16. The computer program product of claim 15, wherein determining the reference measurement comprises:
providing power to a reference current source in the electronic package;
enabling, via a state machine, a first electrical calibration path in an integrated circuit (IC) of the electronic package;
measuring first path factors for the first electrical calibration path in the IC;
enabling, via the state machine, a second electrical calibration path in an interposer IC of the electronic package;
measuring second path factors for the second electrical calibration path in the interposer IC; and
determining from the first path factors and the second path factors, the reference measurement for the electronic flow path.

17. The computer program product of claim 15, wherein measuring the performance measurement for the electronic flow path comprises:
enabling, via a state machine, the electronic flow path; and
measuring electronic flow path factors via the internal measurement circuit.

18. The computer program product of claim 15, wherein determining the operational status comprises:
comparing the reference measurement to the performance measurement; and wherein when the reference measurement is equal to the performance measurement the operational status is the functional operational status, and wherein a fault in the electronic flow path is detected when the reference measurement is less than the performance measurement the operational status is a fault detected status.

19. The computer program product of claim 18, wherein when the operational status is the fault detected status, initiating the fault detection monitoring process for the electronic package further comprises:

enabling a first debug switch for a first path element of a plurality of path elements in the electronic flow path;

measuring debug path factors for the first path element;

detecting a fault status for the first path element;

when the fault status for the first path element indicates a connection fault is present, generating an error report for the first path element; and when the fault status for the first path element indicates a connection fault is not detected, enabling a next debug switch for a next path element.

20. The computer program product of claim 18, wherein when the operational status is the functional operational status, initiating the fault detection monitoring process for the electronic package further comprises:

enabling a debug switch for each path element of a plurality of path elements in the electronic flow path;

measuring debug path factors for the path element associated with a currently enabled debug switch; and storing the debug path factors for further monitoring.

* * * * *